United States Patent [19]
Schwalke

[11] Patent Number: 5,998,271
[45] Date of Patent: Dec. 7, 1999

[54] METHOD OF PRODUCING AN MOS TRANSISTOR

[75] Inventor: Udo Schwalke, Heldenstein, Germany

[73] Assignee: Siemens Aktiengesellschaft, Munich, Germany

[21] Appl. No.: 08/983,239

[22] PCT Filed: Jul. 2, 1996

[86] PCT No.: PCT/DE96/01174

§ 371 Date: Jan. 12, 1998

§ 102(e) Date: Jan. 12, 1998

[87] PCT Pub. No.: WO97/04480

PCT Pub. Date: Feb. 6, 1997

[30] Foreign Application Priority Data

Jul. 18, 1995 [DE] Germany ................. 195 26 184.4

[51] Int. Cl.[6] .................................................. H01L 21/336
[52] U.S. Cl. .................................... 438/301; 438/299
[58] Field of Search ........................... 438/301, 299, 438/197, 510

[56] References Cited

U.S. PATENT DOCUMENTS

| | | | |
|---|---|---|---|
| 4,945,070 | 7/1990 | Hsu ........................................ | 437/160 |
| 5,279,976 | 1/1994 | Hayden et al. | |
| 5,362,662 | 11/1994 | Ando et al. ............................. | 437/52 |
| 5,393,676 | 2/1995 | Ajnum et al. ........................... | 437/24 |
| 5,633,177 | 5/1997 | Ajnum ..................................... | 438/301 |

FOREIGN PATENT DOCUMENTS 0 613 175 A2  8/1994  European Pat. Off. .

OTHER PUBLICATIONS

IEEE Transactions on Electron Devices, vol. 40, No. 12, Dec. (1993), M. Saito et al, P–MOSFET'S with Ultra–Shallow Solid–Phase–Diffused Drain Structure Produced by Diffusion from BSG Gate–Sidewall, pp. 2264–2270.

IEEE (1993) P.B. Griffin et al, Species, Dose and Energy Dependence of Implant Induced Transient Enhanced Diffusion, pp. 295–298.

1994 Symposium on VLSI Technology Digest of Technical Papers, M. Togo et al, Novel Deep Sub–Quarter Micron PMOSFET'S with Ultra–Shallow Junctiions Utilizing Boron Diffusion from Poly–Si/Oxide (BDSOX), pp. 21–22.

1046B, Extended Abstracts/Electrochemical Society 87–2 (1987) Princeton, New Jersey, Abstract No. 690, Y. Sato et al, Enhanced Boron Diffusion Through Thin Silicon Dioxide in Vet Oxygen Atmosphere, pp. 978–979.

IEDM, 1988, C.Y. Wong et al, Doping of $N^+$ and $P^+$ Poly––Silicon in a Dual–Gate CMOS Process, pp. 238–241.

IEDM, 1987, R.B. Fair, Process Models for Ultra–Shallow Junction Technologies, pp. 260–263.

IEDM, 1993, T. Eguchi et al, New Dual Gate Doping Process Using In–Situ Boron Doped–Si for Deep–Sub–$\mu$m CMOS Device, pp. 831–834.

IEDM 1994, D.C.M. Yu et al, Low Threshold Voltage CMOS Devices with Smooth Topography for 1 Volt Applications, pp.489–492.

IEDM, 1994. T. Hori, A 0.1–$\mu$m CMOS Technology with Tilt–Implanted Punchthrough Stopper (TIPS), pp. 75–78.

*Primary Examiner*—John F. Niebling
*Assistant Examiner*—Walter L. Lindsay, Jr.
*Attorney, Agent, or Firm*—Hill & Simpson

[57] ABSTRACT

In the manufacture of an MOS transistor in a substrate (1), source/drain zones (9) and a doped gate electrode (10) are simultaneously formed by drive-out from a doped layer (8). The dopant distribution in the source/drain zones (9) is set by a permeable diffusion barrier (7) at the surface of the source/drain zones (9). Over and above this, a dopant barrier (3'0 can be provided that prevents dopant from the gate electrode (10) from proceeding into the semiconductor substrate (1).

8 Claims, 4 Drawing Sheets

METHOD OF PRODUCING AN MOS TRANSISTOR

BACKGROUND OF THE INVENTION

MOS transistors that are operated with supply voltage $V_{dd}$<2 Volts are increasingly utilized for battery-operated circuit applications as well as for logic circuits with high packing density. Gate lengths and cut-off voltages must be correspondingly scaled in order to assure an adequate current yield (performance) given such supply voltages. Typical gate lengths of such MOS transistors typically lie below ¼ μm. The cut-off voltages $V_t$ are <0.3 volts. High demands made of the short channel behavior of the MOS transistors are connected therewith. These demands cause shallow source/drain regions having a depth below 100 nm and a technology with gate electrodes optimized with respect to the work function. Usually, $n^+$-doped polysilicon gate electrodes for n-channel MOS transistors and $p^+$-doped gate electrodes of polysilicon for p-channel MOS transistors (what is referred to as dual work function gate technology) is employed for optimizing the work function of the gate electrodes.

Since, in dual work function gate technology, the gate electrodes of polysilicon and the source/drain zones of the respective transistor are doped of the same conductivity type, gate electrode and source/drain zones can be fundamentally simultaneously doped by an ion implantation. Since, however, the gate electrode must also be highly doped given MOS transistors with shallow source/drain zones in order to avoid sacrifices in the current yield due to dopant depletion in the gate (gate depletion; see, for example, C. Y. Wong et al., IEDM '88, p. 238), the demands for the formation of shallow source/drain zones and highly doped gate electrodes by implantation are so different that this possibility is out of the question for MOS transistors with shallow source/drain zones.

A spread of the implantation profile that limits the minimum depth of shallow doped zones occurs in the ion implantation due to various effects. As a result of what is referred to as the channeling effect, a not inconsiderable part of the dopant penetrates more deeply into the crystal than corresponds to the range of the ions. The channeling tail that is thereby formed spreads the implantation profile. Since this effect is a result of the regularities in the crystal lattice, it has been proposed (see R. B. Fair, IEDM '87, p. 260) to render the region in the silicon in which the doped region is formed amorphous by an additional implantation with silicon or germanium before the implantation of dopant (what is referred to as pre-amorphization). The crystal damage produced in the implantation of silicon of germanium must be cured in additional tempering steps after the doping.

The implantation profile is also spread in that silicon inter-lattice atoms that produce an increase in the diffusion rate, particularly given the dopants of boron and phosphorus, are formed in the implantation (see P. B. Griffin et al., IEDM '93, p. 295).

In known methods for manufacturing MOS transistors with shallow source/drain zones, the doping of gate electrode and source/drain zones is optimized in two steps.

T. Eguchi et al., IEDM '93, p. 831, discloses a method wherein the gate electrodes are formed from polysilicon doped in situ. The source/drain zones are formed by implantation after structuring the gate electrodes. An added outlay of 1 to 2 photoresist masks derives in this process.

D. C. M. Yu et al., IEDM '94, p. 489, discloses a method wherein the source/drain zones and the gate electrode are respectively formed in a separate implantation step. In the source/drain implantation, the ion beam is angled and beam in with extremely low energy. A separate mask is required for each of the implantations.

T. Hori, IEDM '94, p. 75, discloses a method for the manufacture of an MOS transistor with shallow source/drain zones wherein the depth of the source/drain zones is subsequently reduced by an additional, angled counter-implantation. The gate electrode is covered by an additional mask in this counter-implantation.

M. Togo et al., VLSI Symp. '94, p. 21, discloses a method for the manufacture of and MOS transistor wherein a gate electrode is first produced on a semiconductor substrate provided with a gate oxide. Regions in which source/drain zones are provided are covered with the gate oxide to the side of the gate electrode. Subsequently, a polysilicon layer that covers the regions for the source/drain zones and the gate electrode is deposited. The polysilicon layer is $p^+$-doped by implantation. The source/drain zones are subsequently formed by diffusion. Finally, the polysilicon layer is removed. Here, too, the gate electrode is doped before the production of the source/drain zones.

SUMMARY OF THE INVENTION

The invention is specifying a method for the manufacture of an MOS transistor with which shallow source/drain zones can be produced and wherein the process outlay is reduced compared to the known methods, particularly with respect to the required masks.

In general terms the present invention is a method for the manufacture of an MOS transistor. A gate dielectric and a silicon structure are generated on a semiconductor substrate such that the surface of the semiconductor substrate is uncovered, at least in regions in which source/drain zones are provided. A permeable diffusion barrier is generated at least at the surface of the regions for the source/drain zones. A doped layer is formed that covers the surface of the permeable diffusion barrier in the area of the regions for the source/drain zones and covers the surface of the silicon structure. The silicon structure is doped for the formation of a gate electrode by drive-out from the doped layer and the source/drain zones are simultaneously formed by drive-out from the doped layer, whereby the dopant diffuses through the permeable diffusion barrier.

Advantageous developments of the present invention are as follows.

The silicon structure and the gate dielectric are formed such that a dopant barrier takes effect between the silicon structure and the semiconductor substrate.

A nitrogen-containing silicon layer is generated as dopant barrier between the gate dielectric and the silicon structure.

The gate dielectric is formed of a nitrided oxide or of a high-temperature $RTO$-$SiO_2$, so that the gate dielectric acts as dopant barrier.

An $Si_3N_4$ covering is formed at the surface of the regions for the source/drain zones, is implemented for the formation of the permeable diffusion barrier. The $Si_3N_4$ covering is removed selectively relative to $SiO_2$.

A surface-wide implantation with F, Ar, Xe or Si is implemented before the drive-out for the formation of the source/drain zones and of the gate electrode.

The doped layer is formed by in-situ-doped deposition of a doped silicon layer. The doped silicon layer ensues such that the doped silicon layer is simultaneously oxidized.

In the inventive method, the source/drain zones and the gate electrode are simultaneously formed by drive-out from a doped layer. The different demands made of the dopant profile in the source/drain zones and the gate electrode are met in that a permeable diffusion barrier through which the diffusion ensues is arranged at the surface of the source/drain zones. For example, a thin boundary surface oxide having a thickness between 0.1 and 10 nm is suitable as diffusion barrier. The drive-out into the semiconductor substrate is reduced by the diffusion barrier; however, it is not completely blocked. Since, on the other hand, the doped layer is arranged directly on the surface of the silicon structure, an unimpeded drive-out occurs in the formation of the gate electrode by doping from the silicon structure, so that a high doping is achieved here, preferably in the range $5 \times 10^{19}$ through $5 \times 10^{21}$ atoms/cm$^3$.

The semiconductor substrate is preferably composed of monocrystalline silicon, at least in the region of the MOS transistor. This can thereby be a matter both of a monocrystalline silicon wafer as well as of the silicon layer of an SOI substrate.

The doped layer can be formed by deposition of an undoped layer of, for example, polysilicon and subsequent doping by diffusion or implantation. A double layer of undoped, amorphous or polycrystalline silicon and doped glass, for example PSG or BSG, can be produced for the formation of the doped layer. The doped glass can thereby be formed by deposition or occupation. Preferably, the doped layer is formed by in-situ-doped deposition of doped silicon or doped glass. The doped layer is preferably formed of doped polysilicon since an oxidation of the doped layer is possible in this case in the drive-out of the dopant. Further, the production of doped polysilicon layers is a standard step in MOS technologies.

The formation of the doped layer by in-situ-doped deposition of, for example, doped polysilicon or doped glass has the advantage that no implantation steps are required for the formation of the source/drain zones and of the gate electrode. The problems connected with the implantation, such as channeling or increased implantation rate due to crystal damage, in the methods known from the Prior Art are thus eliminated. In the inventive method, thus, it is also possible to manufacture shallow gate structures having a thickness of the gate electrode below 150 nm. Such shallow gate structures lead to a reduction of the topology, imaging errors and etching tolerances in the photolithography and the etching technique for the production of the structures being thus minimized. This is especially important given structural sizes <¼ μm. Given a reduced topology, further, the steps at the surface of the structure are lower, so that the demands made of a concluding planarization, for example with BPSG, are lower. Flow temperature and flow times can be reduced due to the diminished step height. The overall structure is thus subjected to a reduced thermal budget, this having a beneficial effect on the obtainable source/drain dopant profiles.

It lies within the scope of the invention to form the silicon structure and the gate dielectric such that a dopant barrier is present between the silicon structure and the semiconductor substrate. This ensues, for example, in that a layer of nitrogen-containing silicon that is structured simultaneously with the silicon structure is generated between the gate dielectric and the silicon structure. Alternatively, the gate dielectric is formed of a nitrided oxide or of a high-temperature RTO-SiO$_2$. Nitrogen-containing silicon as well as nitrided oxide or, respectively, high temperature RTO-SiO$_2$ have the property of being impenetrable for dopant. This embodiment has the advantage that a penetration of dopant through the silicon structure and the gate dielectric into the channel region, for example due to the channeling effect, is prevented even given a formation of the doped layer by deposition of an undoped layer and subsequent implantation.

The permeable diffusion barrier is preferably formed self-aligned at the surface of the source/drain zones. To that end, the surface of the silicon structure is provided with a Si$_3$N$_4$ covering. A thermal oxidation is subsequently implemented, whereby the permeable diffusion barrier is formed as SiO$_2$ layer at the surface of regions at which source/drain zones are provided. Finally, the Si$_3$N$_4$ covering is removed selectively relative to SiO$_2$.

The permeability of the permeable diffusion barrier can be influenced by a surface-wide implantation with F, Ar, Xe or Si. In this case, the diffusion rate through the diffusion barrier increases. This measure leads to a larger process window with respect to the thickness of the permeable diffusion barrier.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
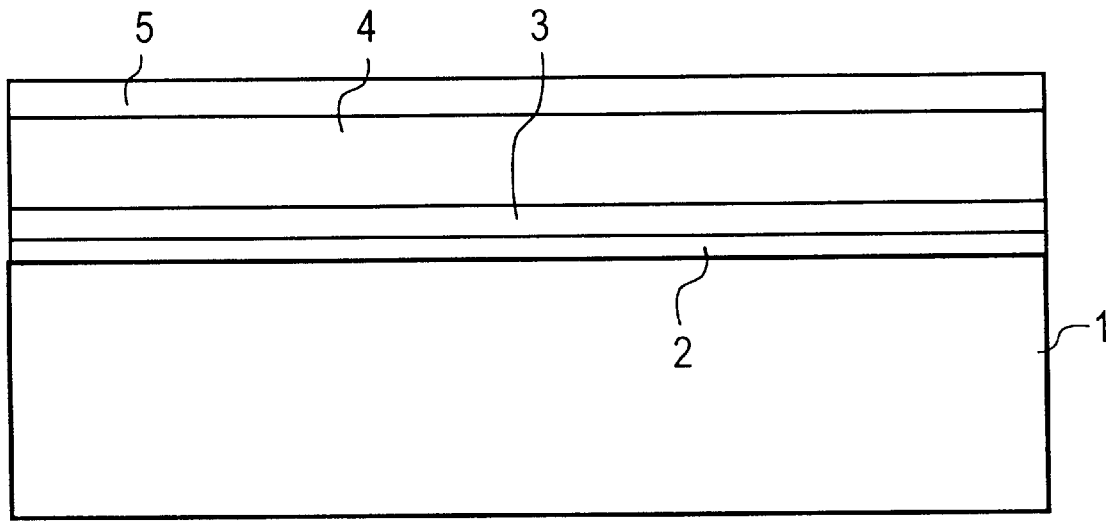
FIG. 1 shows a semiconductor substrate with a multiple layer.

A gate oxide 2 (see FIG. 1) is applied onto a substrate 1 of, for example, monocrystalline silicon. The gate oxide 2 is formed in a thickness of, for example, 3 through 10 nm by thermal oxidation.

A nitrogen-containing silicon layer 3 is applied onto the gate oxide 2. The nitrogen-containing silicon layer 3 is generated in a thickness of 2 through 20 nm. It is formed by reactive sputtering to [sic] amorphous SiN, by in-situ-doped deposition of nitrogen-doped polysilicon or by undoped deposition and subsequent implantation of polysilicon.

A silicon layer 4 is applied onto the nitrogen-containing silicon layer 3. The silicon layer 4 is generated in a thickness of, for example, 20 through 150 nm. It is formed by deposition of amorphous silicon or polysilicon. It is preferably generated of amorphous silicon because of the more beneficial texture with reference to dopant distribution and structurability.

A $Si_3N_4$ cover layer 5 is applied onto the silicon layer 4. The $Si_3N_4$ cover layer 5 is applied in a thickness of, for example, 2 through 20 nm.

Figure 2:
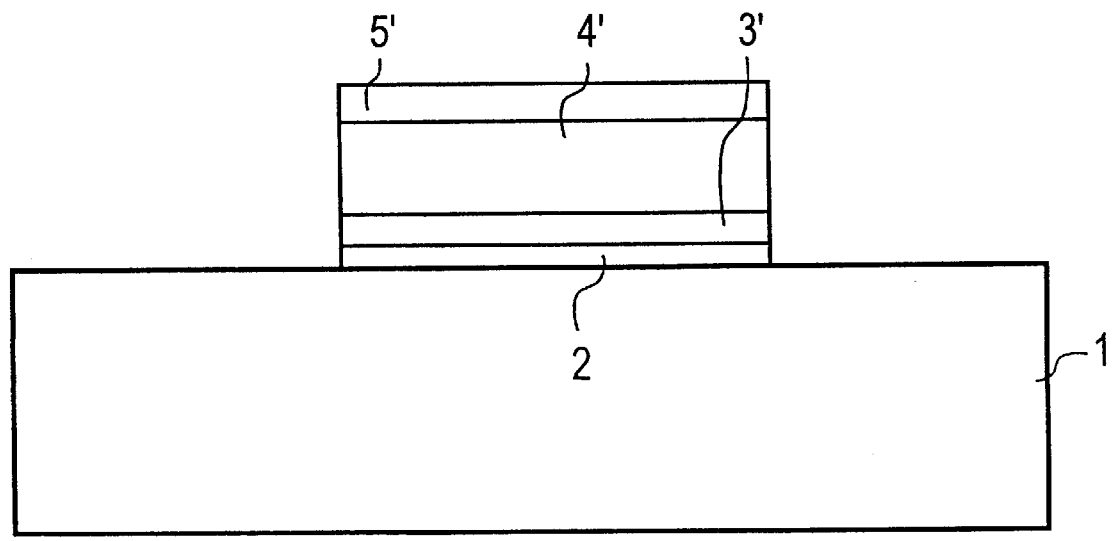
FIG. 2 shows the semiconductor substrate after structuring of the multiple layer for the formation of a gate dielectric and a silicon structure.

The layer format formed of nitrogen-containing silicon layer 3, silicon layer 4 and $Si_3N_4$ cover layer 5 is structured with the assistance of photolithographic process steps and a photoresist mask. The gate oxide 2 is thereby also structured. The nitrogen-containing silicon layer 3 thereby becomes a dopant barrier 3', the silicon layer 4 becomes a silicon structure 4' and the $Si_3N_4$ cover layer 5 becomes a $Si_3N_4$ covering 5'. The $Si_3N_4$ covering 5', the silicon structure 4', the dopant barrier 3' as well as the gate oxide 2 exhibit common sidewalls. The surface of the substrate 1 is uncovered therebeyond, at least in regions in which source/drain zones are formed (see FIG. 2).

Figure 3:
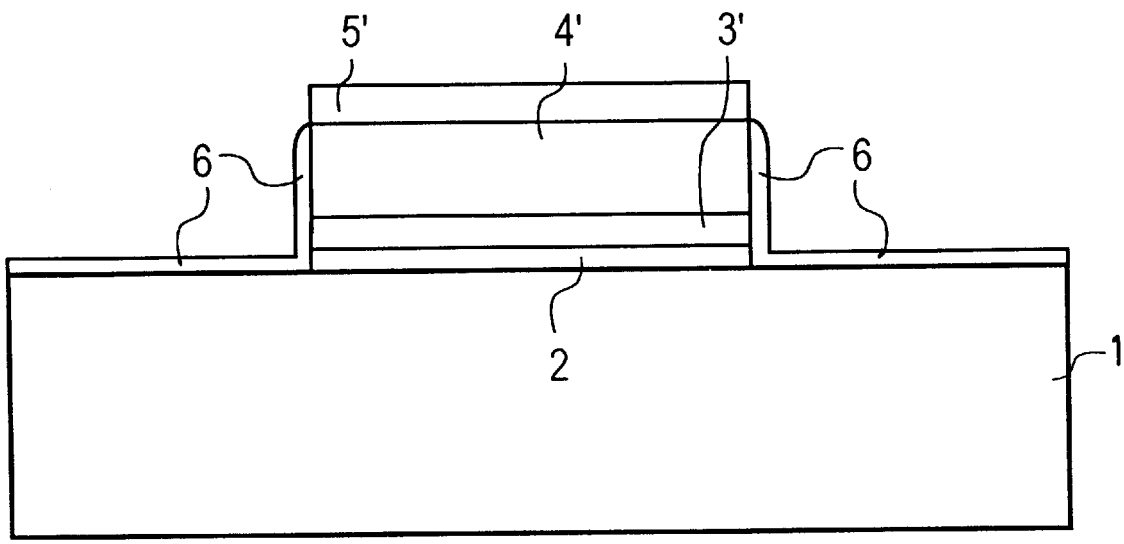
FIG. 3 shows the semiconductor substrate after a thermal oxidation.

A thermal oxidation for the formation of a $SiO_2$ layer 6 is implemented after removal of the photoresist mask (not shown). The $SiO_2$ layer comprises a thickness of 5 through 20 nm and is arranged at the uncovered sidewalls of the silicon structure 4' and of the dopant barrier 3' as well as on the uncovered surface of the substrate 1 (see FIG. 3). The surface of the silicon structure 4' is thereby protected against oxidation by the $Si_3N_4$ covering 5'.

Figure 4:
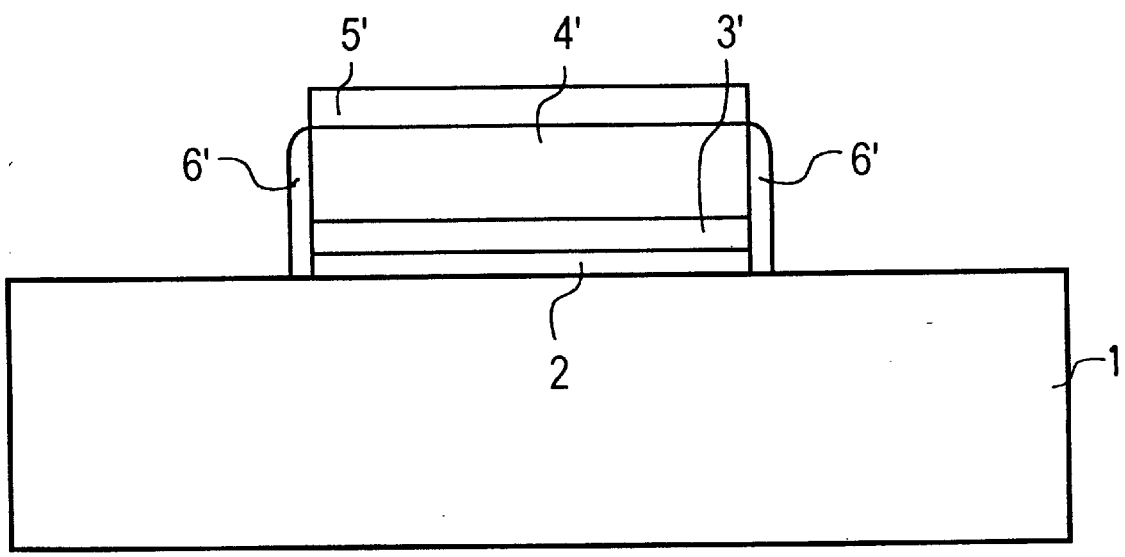
FIG. 4 shows the semiconductor substrate after a spacer etching.

Horizontal parts of the $SiO_2$ layer 6 are removed by an anisotropic dry etching, for example with $CHF_3$/Ar gas. $SiO_2$ spacers 6' are thereby formed at the sidewalls of the silicon structure 4', of the dopant barrier 3' and of the gate oxide 2. The surface of the substrate 1, by contrast, is uncovered in the regions in which source/drain zones are produced (see FIG. 4).

Figure 5:
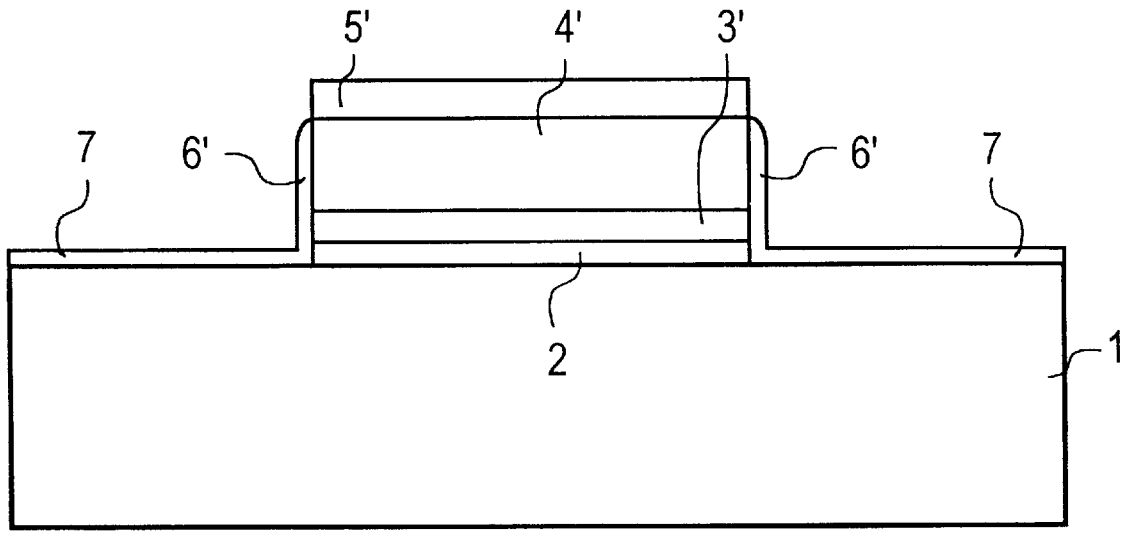
FIG. 5 shows the semiconductor substrate after formation of a permeable diffusion barrier.
Figure 6:
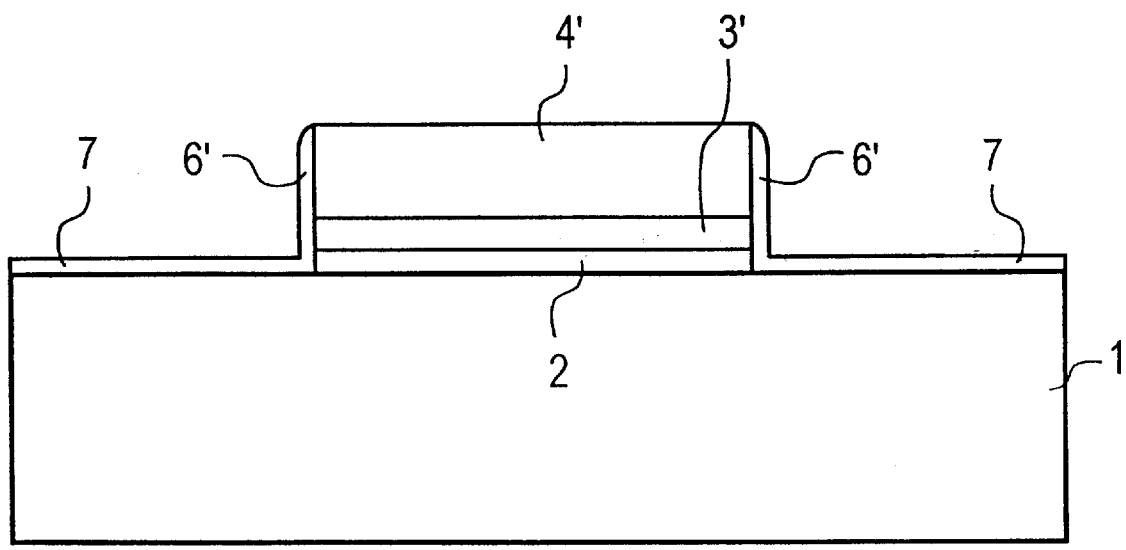
FIG. 6 shows the semiconductor substrate after removal of an Si$_3$N$_4$ covering.

A permeable diffusion barrier is formed as boundary surface oxide on the uncovered surface of the substrate 1 by a designational thermal oxidation at, for example, 500 through 800° C. (see FIG. 5). The permeable diffusion barrier is formed in a thickness of 0.1 through 10 nm. Subsequently, the $Si_3N_4$ covering 5' is wet-chemically removed, for example with $H_3PO_4$. It is critical in the removal of the $Si_3N_4$ covering 5' that a selectivity is present with respect to $SiO_2$, so that the permeable diffusion barrier 7 comprises a defined thickness (see FIG. 6).

Figure 7:
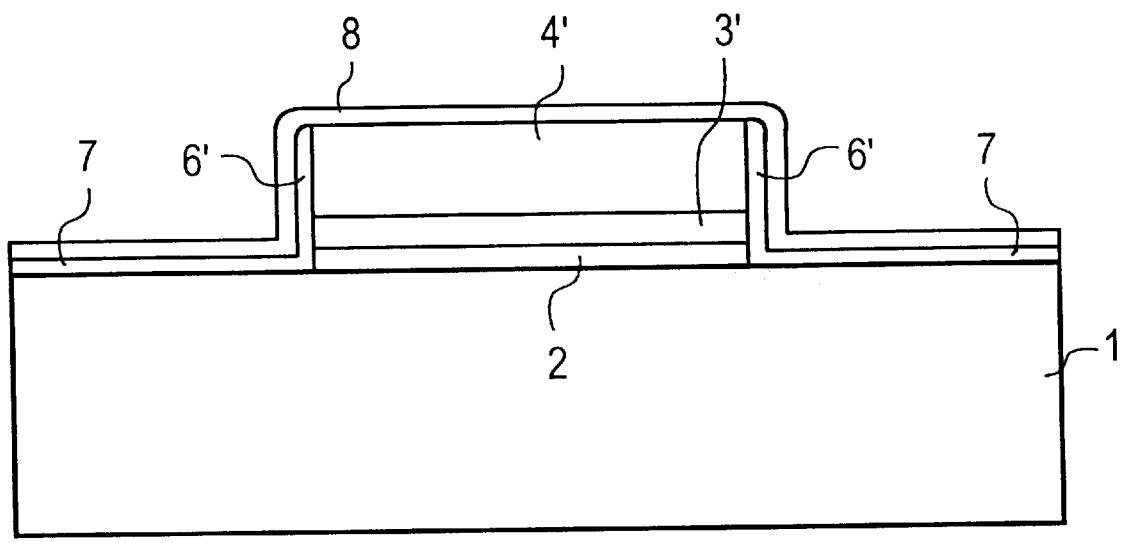
FIG. 7 shows the semiconductor substrate after application of a doped layer.

Subsequently, a doped layer 8 is applied surface-wide. For example, the doped layer 8 is generated by in-situ-doped deposition of amorphous silicon or polysilicon. The doped layer 8 is, for example, boron-doped with a dopant concentration of $10^{20}$ through $10^{22}$ $cm^{-3}$. The doped layer 8 is deposited in a thickness of, for example, 10 through 100 nm (see FIG. 7).

Figure 8:
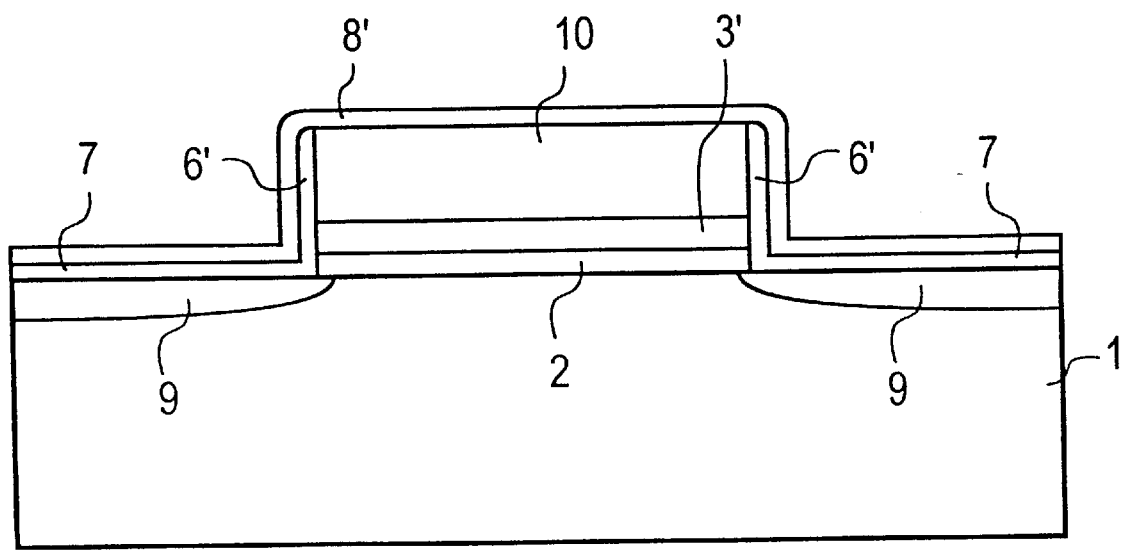
FIG. 8 shows the semiconductor substrate after an MOS transistor is finished.

Dopant from the doped layer 8 is driven into the substrate 1 as well as into the silicon structure 4' by a tempering step in an oxidizing atmosphere, for example in $H_2O$ at 1000° C. p-doped source/dran zones 9 are thereby generated in the substrate 1. At the same time, a $p^+$-doped gate electrode 10 is formed by doping of the silicon structure 4'. Further, the doped layer 8 becomes a $SiO_2$ layer 8' by oxidation. What the permeable diffusion barrier 7 effects is that the depth of the source/drain zones 9 (see FIG. 8) amounts to approximately 60 nm given a dopant concentration of approximately $10^{19}$.

At the same time, a dopant concentration of $10^{20}$ $cm^{-3}$ is set in the gate electrode. The dopant is uniformly distributed in the gate electrode 10. During drive-in of the dopant, the dopant barrier 3' prevents a penetration of the dopant into the channel region of the MOS transistor.

Alternatively, the gate oxide 2 can be formed of nitrided oxide or of an $RTO-SiO_2$. These materials act as dopant barriers, so that the dopant barrier 3' can be omitted in this case. Nitrided oxide is formed by oxidation at 1100° C., 5 through 60 s in $O_2$ atmosphere, deposition of $Si_3N_4$ at 900 through 1100° C. upon employment of $NH_3$ and/or $N_2O$ and subsequent re-oxidation at 1150° C. $RTO-SiO_2$ is formed by oxidation at 1100° C., 5 through 60 s in $O_2$ atmosphere and subsequent tempering at 1000° C.

The diffusion of the dopant through the permeable diffusion barrier 7 can be optimized in that a surface-wide implantation with F, Ar, Xe or Si is implemented before the drive-out. These ion implantations generate inter-lattice atoms that accelerate a diffusion.

Finally, the MOS transistor is finished by deposition of a planarizing layer of, for example, BPSG and planarization as well as via hole etching and metallization (not shown).

Alternatively, the $SiO_2$ layer 8' can be anisotropically etched after the formation of the source/drain zones, whereby the surface of the source/drain zones 9 and of the gate electrode 10 are uncovered. The surface of the source/drain zones 9 and of the gate electrode 10 is then selectively provided with metal silicide. This ensues, for example, in a salicide process.

The invention was described with reference to the example of a PMOS transistor: it can likewise be transferred to an NMOS transistor. In this case, arsenic or phosphorous is employed as dopant. The thickness of the boundary surface oxide employed as permeable diffusion barrier amounts to 0.1 through 1 nm in this case.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A method for manufacturing an MOS transistor, comprising the steps of:

providing a semiconductor substrate having a surface;

generating a gate dielectric and a silicon structure on the semiconductor substrate such that the surface of the semiconductor substrate is uncovered, at least in regions of source/drain zones;

generating a permeable diffusion barrier at least at a surface of the regions for the source/drain zones, the permeable diffusion barrier containing $S_iO_2$;

forming a doped layer that covers a surface of the permeable diffusion barrier in an area of the regions for the source/drain zones and that covers the surface of the silicon structure;

doping the silicon structure for formation of a gate electrode by drive-out from the doped layer, the source/drain zones being simultaneously formed by drive-out from the doped layer, whereby the dopant diffuses through the permeable diffusion barrier.

2. The method according to claim 1, wherein the silicon structure and the gate dielectric are formed such that a dopant barrier is effected between the silicon structure and the semiconductor substrate.

3. The method according to claim 2, wherein a nitrogen-containing silicon layer is generated as the dopant barrier between the gate dielectric and the silicon structure.

4. The method according to claim 1, wherein a surface-wide implantation with one of F, Ar, Xe or Si is implemented before the drive-out for formation of the source/drain zones and the gate electrode.

5. The method according to claim 1, wherein the doped layer is formed by in-situ-doped deposition of a doped silicon layer.

6. The method according to claim 5, wherein the drive-out from the doped silicon layer ensues such that the doped silicon layer is simultaneously oxidized.

7. A method for manufacturing an MOS transistor, comprising the steps of:

providing a semiconductor substrate having a surface;

generating a gate dielectric and a silicon structure on the semiconductor substrate such that the surface of the semiconductor substrate is uncovered, at least in regions of source/drain zones;

generating a permeable diffusion barrier at least at a surface of the regions for the source/drain zones, the permeable diffusion barrier containing $S_iO_2$;

forming a doped layer that covers a surface of the permeable diffusion barrier in an area of the regions for the source/drain zones and that covers the surface of the silicon structure;

doping the silicon structure for formation of a gate electrode by drive-out from the doped layer, the source/drain zones being simultaneously formed by drive-out from the doped layer, whereby the dopant diffuses through the permeable diffusion barrier, the silicon structure and the gate dielectric being formed such that a dopant barrier is effected between the silicon structure and the semiconductor substrate, and the gate dielectric being formed of one of a nitrided oxide or of a high-temperature $RTO-SIO_2$, so that the gate dielectric acts as the dopant barrier.

8. A method for manufacturing an MOS transistor, comprising the steps of:

providing a semiconductor substrate having a surface;

generating a gate dielectric and a silicon structure on the semiconductor substrate such that the surface of the semiconductor substrate is uncovered, at least in regions of source/drain zones;

generating a permeable diffusion barrier at least at a surface of the regions for the source/drain zones, the permeable diffusion barrier containing $S_iO_2$;

forming a doped layer that covers a surface of the permeable diffusion barrier in an area of the regions for the source/drain zones and that covers the surface of the silicon structure;

doping the silicon structure for formation of a gate electrode by drive-out from the doped layer, the source/drain zones being simultaneously formed by drive-out from the doped layer, whereby the dopant diffuses through the permeable diffusion barrier;

forming an $Si_3N_4$ covering at the surface of the silicon structure;

forming an $SiO_2$ layer at the surface of the regions for the source/drain zones, and implementing a thermal oxidation for formation of the permeable diffusion barrier; and removing the $Si_3N_4$ covering selectively relative to the $SiO_2$ layer.

* * * * *